United States Patent
Chong et al.

(10) Patent No.: US 7,972,921 B2
(45) Date of Patent: Jul. 5, 2011

(54) INTEGRATED CIRCUIT ISOLATION SYSTEM

(75) Inventors: Yung Fu Chong, Singapore (SG); Zhijiong Luo, Carmel, NY (US)

(73) Assignees: GlobalFoundries Singapore Pte. Ltd., Singapore (SG); International Business Machines Corporation, Armonk, NY (US)

( * ) Notice: Subject to any disclaimer, the term of this patent is extended or adjusted under 35 U.S.C. 154(b) by 344 days.

(21) Appl. No.: 11/369,239

(22) Filed: Mar. 6, 2006

(65) Prior Publication Data

US 2007/0205469 A1    Sep. 6, 2007

(51) Int. Cl.
*H01L 21/8238* (2006.01)
(52) U.S. Cl. ......... 438/221; 438/222; 257/506; 257/510
(58) Field of Classification Search ................. 257/506, 257/510; 438/199, 221, 222
See application file for complete search history.

(56) References Cited

U.S. PATENT DOCUMENTS

| 6,894,354 | B2 | 5/2005 | Jono et al. | |
| 6,905,967 | B1 | 6/2005 | Tian et al. | |
| 6,914,016 | B2 | 7/2005 | Tan et al. | |
| 6,939,780 | B2 * | 9/2005 | Yun et al. | 438/437 |
| 6,946,359 | B2 | 9/2005 | Yang et al. | |
| 7,045,468 | B2 * | 5/2006 | Liang | 438/753 |
| 2002/0055216 | A1 * | 5/2002 | Takeuchi | 438/221 |
| 2005/0139952 | A1 * | 6/2005 | Koh | 257/510 |
| 2007/0099362 | A1 * | 5/2007 | Chidambarrao et al. | 438/197 |
| 2007/0246754 | A1 * | 10/2007 | Sonsky et al. | 257/288 |

* cited by examiner

*Primary Examiner* — Phat X Cao
(74) *Attorney, Agent, or Firm* — Mikio Ishimaru

(57) ABSTRACT

A method of manufacturing a self-aligned inverted T-shaped isolation structure. An integrated circuit isolation system including providing a substrate, forming a base insulator region in the substrate, growing the substrate to surround the base insulator region, and depositing an insulator column having a narrower width than the base insulator region on the base insulator region.

10 Claims, 9 Drawing Sheets form isolations among individual elements, reducing their size as much as possible and ensuring superior isolation while creating more chip space for more elements.

INTEGRATED CIRCUIT ISOLATION SYSTEM

TECHNICAL FIELD

The present invention relates generally to integrated circuit systems, and more particularly to a system for integrated circuit isolation.

BACKGROUND ART

Integrated circuits are used in many portable electronic products, such as cell phones, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous.

As fabrication techniques for semiconductor integrated circuits have developed, the number of elements in a chip has increased. Element size has decreased as integration density has increased. Fabrication line width has decreased from sub-micron to quarter-micron, and smaller. Regardless of the reduction in element size, however, adequate insulation or isolation must be required among individual elements in a chip so that optimal performance can be achieved. The main object is to form isolations among individual elements, reducing their size as much as possible and ensuring superior isolation while creating more chip space for more elements.

Among the different element isolation techniques, local oxidation of silicon (LOCOS) and trench isolation are the most commonly used. The trench isolation technique has received particular notice as it provides a small isolation region and the substrate surface remains level post process. The conventional deposition method for fabricating trench isolations with high aspect ratio requires multiple deposition and etching cycles, thus it is expensive and offers reduced yield. Additionally, as the density of integrated circuits increases and element size is reduced, the deposition method provides inadequate step coverage resulting in incompletely filled trenches, resulting in detrimental isolation and further reduced yields.

As the aspect ratio of the trenches increase to keep up with the increasing density of integrated circuits, the trench process suffers from gap fill issues. In order to avoid gap fill issues, the trench process has become more complicated, such as multiple deposition and sputter/etch steps, and the manufacturing cost has increased. The aspect ratio may also decrease the distance the carrier has to travel to cause isolation failure resulting in increasing failures. The distance may also be further reduced, if isolation structures are misaligned with respect to the circuits they are to protect. The increasing density and higher aspect ratio result in integrated circuits that are more sensitive to isolation variations such as gap fill and misalignment.

As the demand for smaller electronic devices grows, manufacturers are seeking ways to increase density of the elements in the integrated circuit while providing isolation technology and at the same time, reducing manufacturing complexity, costs and failures. Prior attempts to increase density while providing isolation have brought additional fabrication cycles, additional costs, reduced performance and reduced yields.

Thus, a need still remains for an integrated circuit isolation system to provide improved reliability and cost effective manufacturing. In view of the increasing demand for improved density of integrated circuits and in particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit isolation system providing a substrate, forming a base insulator region in the substrate, growing the substrate to surround the base insulator region; and depositing an insulator column having a narrower width than the base insulator region on the base insulator region.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
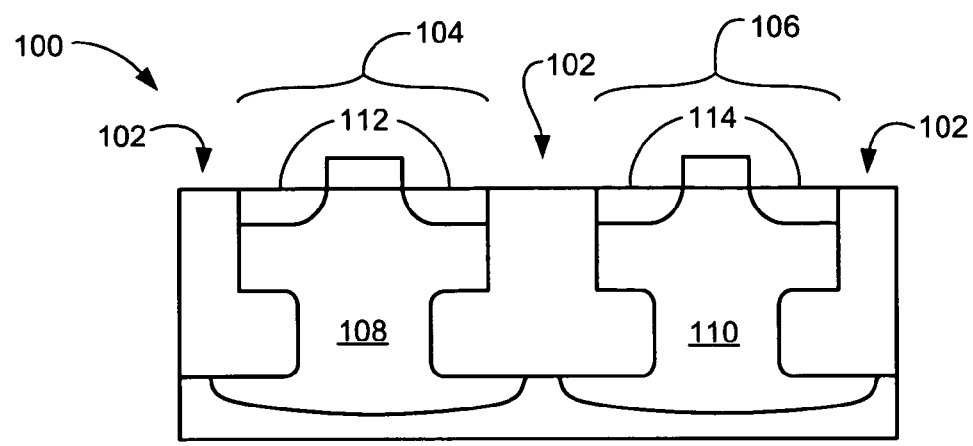
FIG. 1 is a cross-sectional view of an integrated circuit isolation system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "on" as used herein refers to one element or layer in contact with another element or layer.

Referring now to FIG. 1, therein is shown a cross-sectional view of an integrated circuit isolation system 100 in an embodiment of the present invention. A self-aligned inverted T-shaped isolation structure 102 provides isolation between a first device 104, such as a field effect transistor, and a second device 106, such as a field effect transistor. The first device 104 which may be a N-type field effect transistor transferring electrons (not shown), requires electrical isolation from the second device 106 which may be a P-type field effect transistor transferring holes (not shown). The wider base of the self-aligned inverted T-shaped isolation structure 102 provides additional isolation and gives the cross-section a shape of an inverted "T".

A first device body 108, such as a P-well, may not prevent electrons from transferring to a second device body 110, such as an N-well. Conversely, the second device body 110 may not prevent holes from transferring to the first device body 108. The self-aligned inverted T-shaped isolation structure 102 provides electrical isolation to prevent electrons and holes from transferring between the first device 104 and the second device 106 aligned between a first source-drain 112 of the first device 104 and a second source-drain 114 of the second device 106. In one embodiment, the integrated circuit isolation system 100 may include two or more of the self-aligned inverted T-shaped isolation structure 102 each isolated from the other, wherein each of the self-aligned inverted T-shaped isolation structure 102 are completely surrounded by a substrate and directly contacting the substrate except for an insulator column having a width narrower than a base insulator region of the self-aligned inverted T-shaped isolation structure 102. It has been discovered that components of the self-aligned inverted T-shaped isolation structure 102 are self-aligned to one another.

Figure 2:
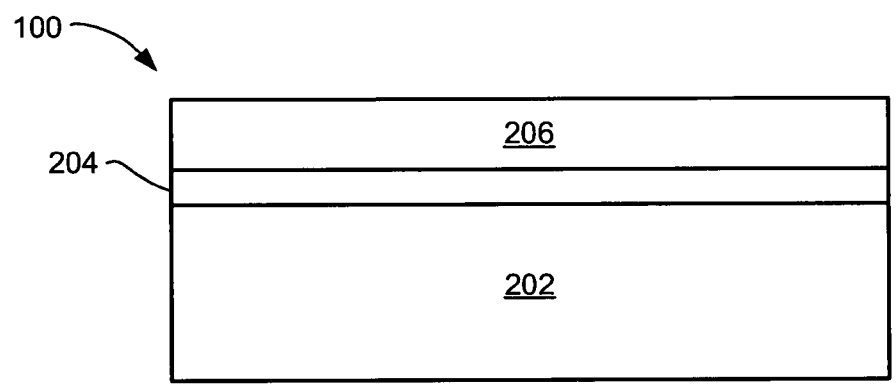
FIG. 2 is a cross-sectional view of the integrated circuit isolation system in a nitride depositing phase.

Referring now to FIG. 2, therein is shown a cross-sectional view of the integrated circuit isolation system 100 in a nitride depositing phase. A substrate 202, such as a silicon substrate, is provided. An insulator, such as a pad oxide layer 204, is applied on the substrate 202. The pad oxide layer 204 may provide an attachment surface for another insulator layer, such as a nitride layer 206. The nitride layer 206 is formed on the pad oxide layer 204. The nitride layer 206 may provide an etch stop layer during etching processes, such as chemical mechanical polishing.

Figure 3:
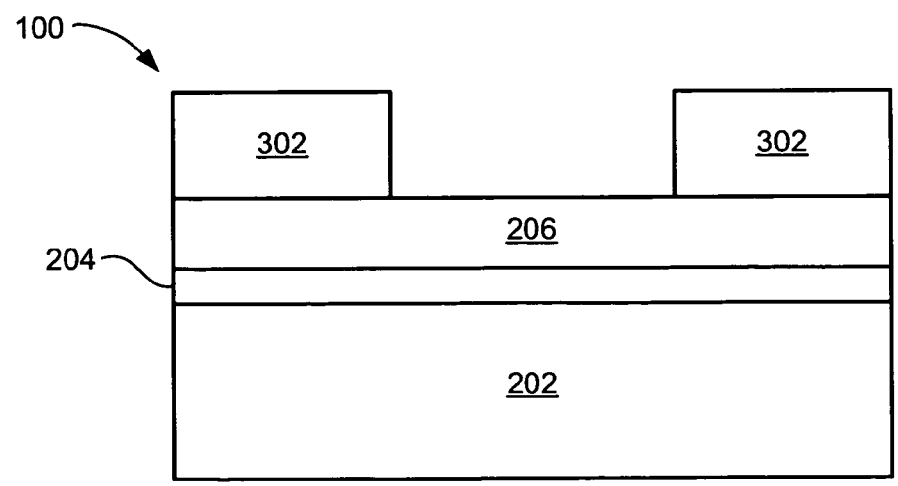
FIG. 3 is a cross-sectional view of the integrated circuit isolation system in a photoresist depositing phase.

Referring now to FIG. 3, therein is shown a cross-sectional view of the integrated circuit isolation system 100 in a photoresist depositing phase. A photoresist 302 is applied on the nitride layer 206. The photoresist 302 may be selectively applied to specific sections or may be applied across an entire region and removed from opening regions. The photoresist 302 provides a barrier to depositing of materials during deposition processes. The photoresist 302 may also be removable.

Figure 4:
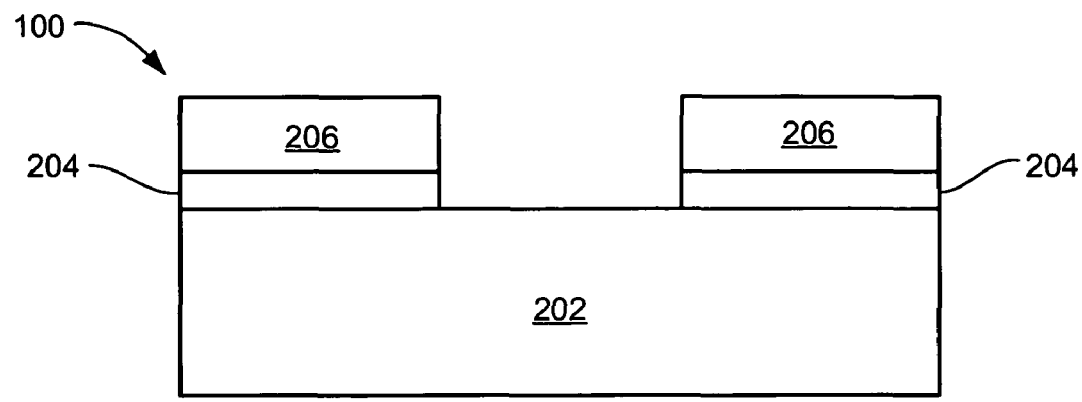
FIG. 4 is a cross-sectional view of the integrated circuit isolation system in a nitride etching phase.

Referring now to FIG. 4, therein is shown a cross-sectional view of the integrated circuit isolation system 100 in a nitride etching phase. An etching process, such as an anisotropic reactive ion etch, removes a portion of the nitride layer 206 and a portion of the pad oxide layer 204 not covered by the photoresist 302 of FIG. 3. The nitride layer 206 and the pad oxide layer 204 are partially removed to form a trench. Further, the photoresist 302 of FIG. 3 is removed, such as a stripping process, from the nitride layer 206.

Figure 5:
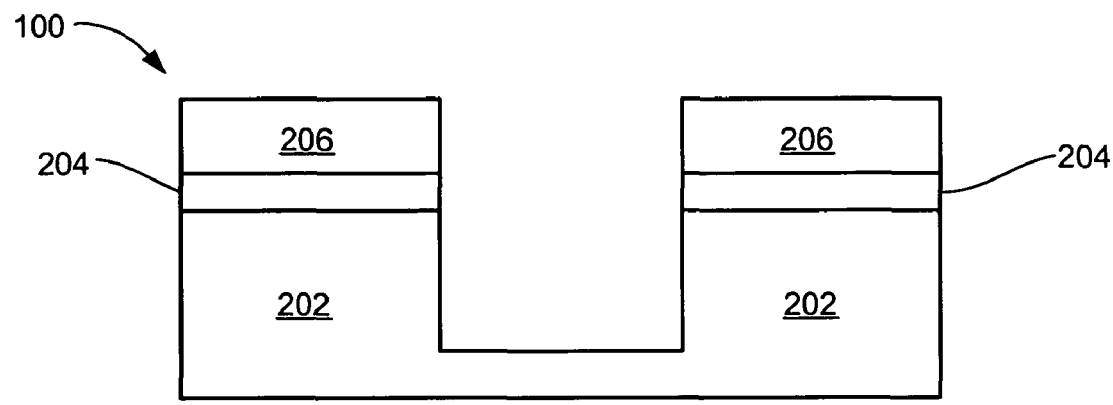
FIG. 5 is a cross-sectional view of the integrated circuit isolation system in a first substrate etching phase.

Referring now to FIG. 5, therein is shown a cross-sectional view of the integrated circuit isolation system 100 in a first substrate etching phase. An etching process, such as an anisotropic reactive ion etch, removes a portion of the substrate 202. The substrate 202 is partially removed to form a trench with planar dimensions substantially the same as the planar dimensions of the trench in the nitride layer 206 and the pad oxide layer 204.

Figure 6:
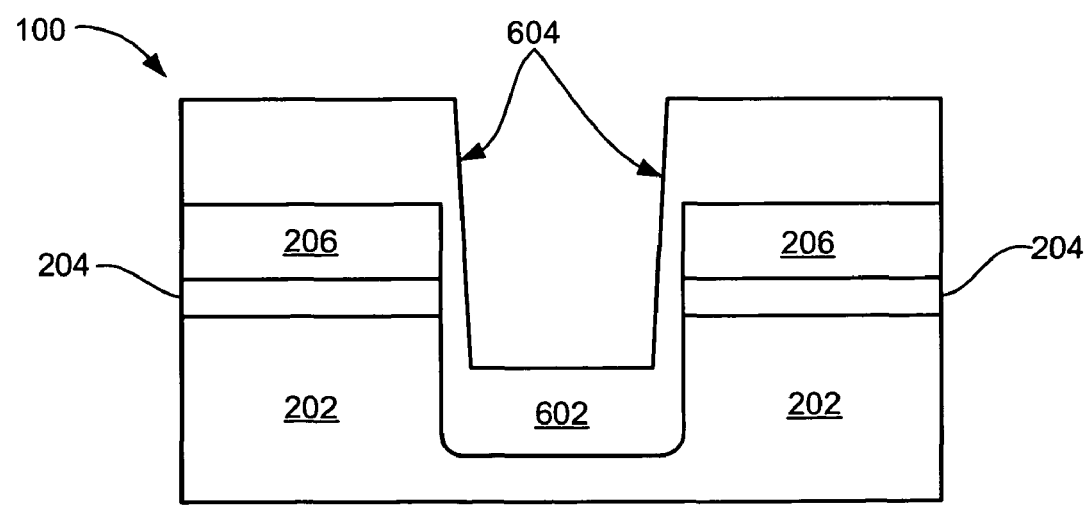
FIG. 6 is a cross-sectional view of the integrated circuit isolation system in an oxide applying phase.

Referring now to FIG. 6, therein is shown a cross-sectional view of the integrated circuit isolation system 100 in an insulator applying phase. An insulator, such as a non-conformal oxide 602, may be formed using one or more processes, such as a thermal oxidation process and a filling process. The filling process can be a high density plasma chemical vapor deposition process (HDP-CVD) process. The non-conformal oxide 602 may have a rounded corner 604 near the upper surface of the non-conformal oxide 602. The rounded corner 604 may be a result of a forming process, such as thermal oxidation. The non-conformal oxide 602 partially fills a bottom of the trench and may form on sides of the trench as well.

Figure 7:
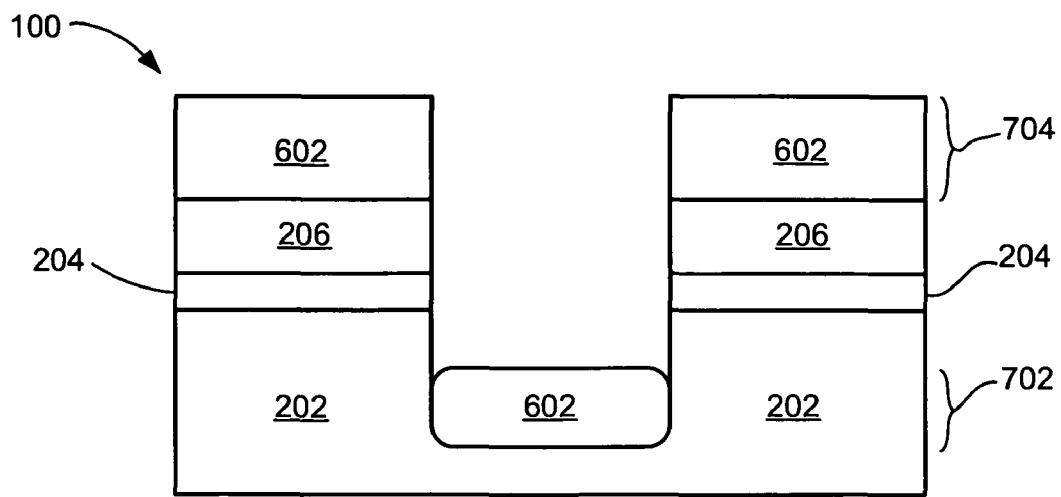
FIG. 7 is a cross-sectional view of the integrated circuit isolation system in an oxide etching phase.

Referring now to FIG. 7, therein is shown a cross-sectional view of the integrated circuit isolation system 100 in an insulator etching phase. The non-conformal oxide 602 is etched back from the sides of the trench. An etching process removes the portion of the non-conformal oxide 602 on the sides of the trench and may remove a portion of the non-conformal oxide 602 filling the bottom of the trench. The etching process provides a base insulator region, such as a base oxide region 702, of the non-conformal oxide 602 on the bottom of the trench and an upper oxide region 704 of the non-conformal oxide 602 on the upper surface of the nitride layer 206. The etching process also substantially exposes an inner side of the nitride layer 206, an inner side of the pad oxide layer 204 an inner side of the non-conformal oxide 602 and an inner side of the substrate 202.

Figure 8:
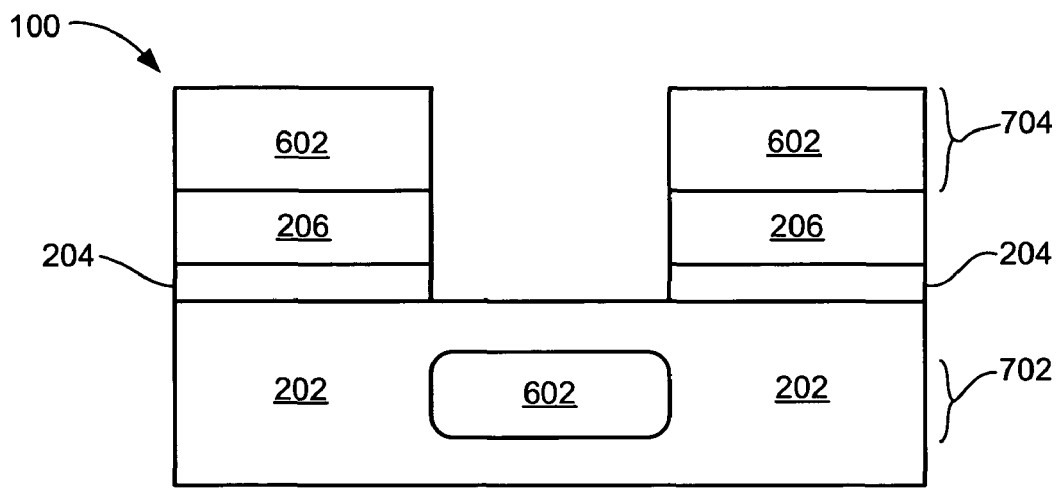
FIG. 8 is a cross-sectional view of the integrated circuit isolation system in a substrate growing phase.

Referring now to FIG. 8, therein is shown a cross-sectional view of the integrated circuit isolation system 100 in a substrate growing phase. A lateral epitaxial growth of the substrate 202 fills the portion of the trench in the substrate 202. In at least one embodiment, the lateral epitaxial growth can be formed only above the base oxide region 702 due to the structure formed by the preceding steps. The lateral epitaxial growth also forms the substrate 202 to surround the base oxide region 702 of the non-conformal oxide 602 filling the bottom of the trench. Further, the lateral epitaxial growth provides a horizontal formation of the substrate 202 providing a substantially planar upper surface of the substrate 202.

Figure 9:
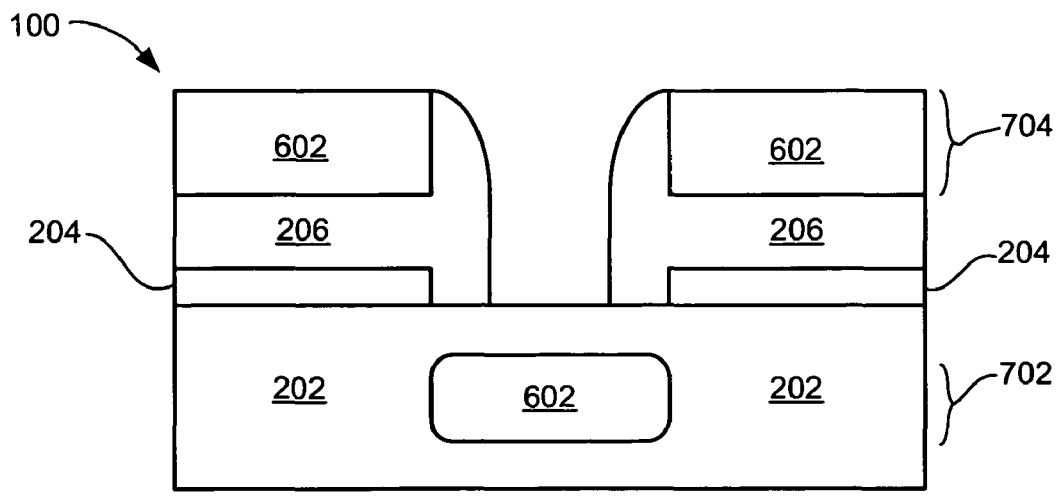
FIG. 9 is a cross-sectional view of the integrated circuit isolation system in a spacer forming phase.

Referring now to FIG. 9, therein is shown a cross-sectional view of the integrated circuit isolation system 100 in a spacer forming phase. The nitride layer 206 is applied into the trench formed by the pad oxide layer 204, the nitride layer 206 and the non-conformal oxide 602. The nitride layer 206 extends across the inner surface of the pad oxide layer 204, the inner surface of the nitride layer 206 and the inner surface of the non-conformal oxide 602. The nitride layer 206 forms an inner spacer reducing the width of the trench.

Figure 10:
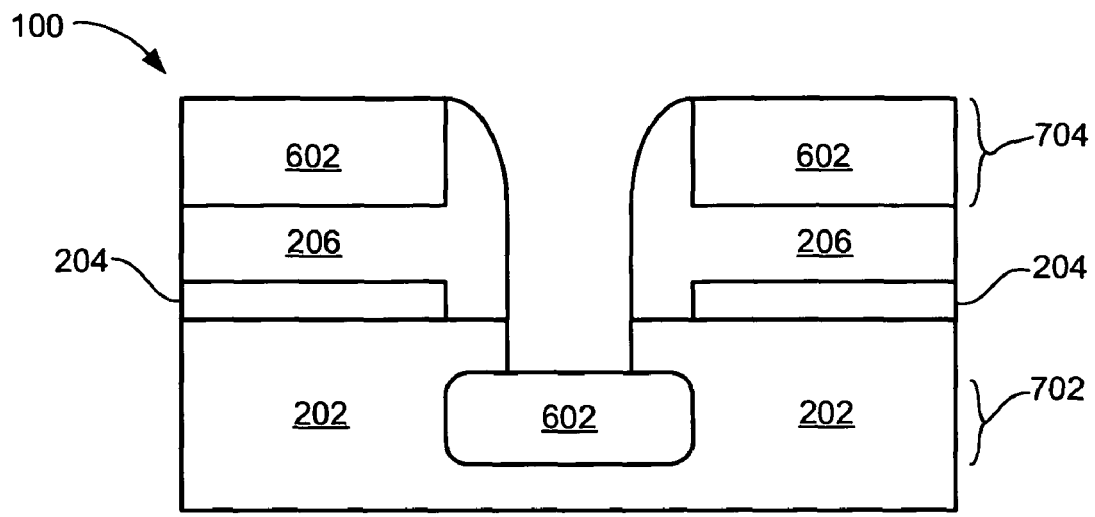
FIG. 10 is a cross-sectional view of the integrated circuit isolation system in a second substrate etching phase.

Referring now to FIG. 10, therein is shown a cross-sectional view of the integrated circuit isolation system 100 in a second substrate etching phase. An etching process, such as an anisotropic reactive ion etch, removes a portion of the substrate 202. The substrate 202 is partially removed to form a recess with planar dimensions substantially the same as the planar dimensions of the recess formed by the inner spacer of the nitride layer 206. The etching process removes the portion of the substrate 202 to the top surface of the base oxide region 702 surrounded by the substrate 202.

Figure 11:
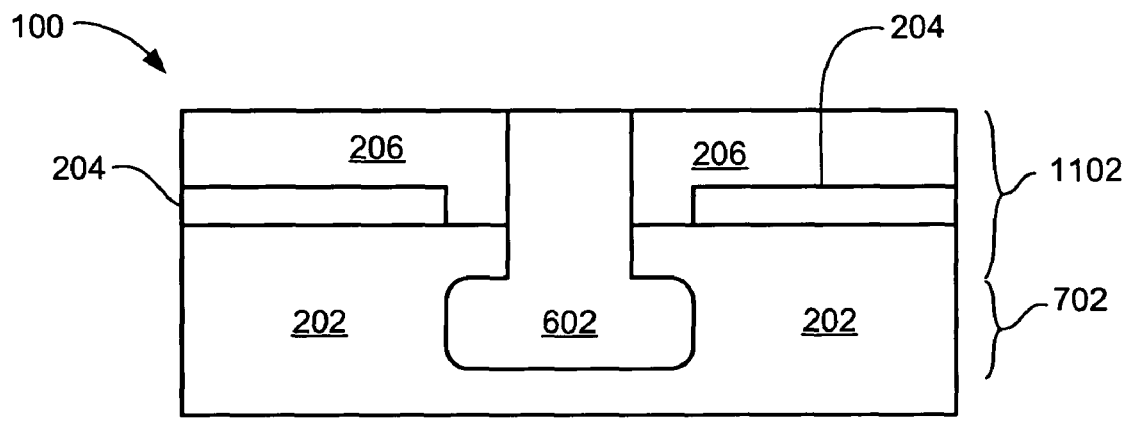
FIG. 11 is a cross-sectional view of the integrated circuit isolation system in an oxide polishing phase.

Referring now to FIG. 11, therein is shown a cross-sectional view of the integrated circuit isolation system 100 in an oxide polishing phase. An oxide material, similar to the non-conformal oxide 602 fills the recess formed by the inner spacer of the nitride layer 206 and the substrate 202. An insulator column, such as an oxide column 1102 of the non-conformal oxide 602, attaches to the base oxide region 702 of the non-conformal oxide 602 forming the self-aligned inverted T-shaped isolation structure 102. A polishing process, such as chemical mechanical polish, may be applied to form the integrated circuit isolation system 100.

Figure 12:
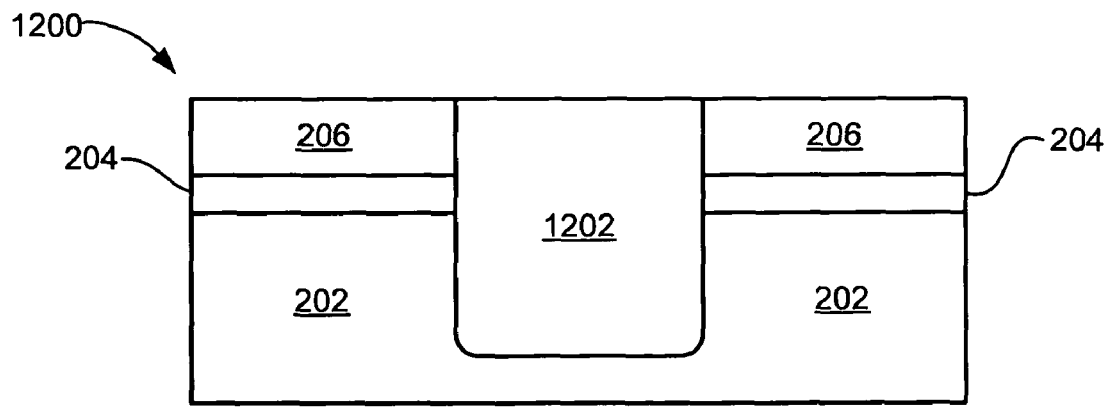
FIG. 12 is a cross-sectional view of a cross-sectional view of an integrated circuit isolation system in an alternative embodiment of the present invention in an oxide applying phase.

Referring now to FIG. 12, therein is shown a cross-sectional view of an integrated circuit isolation system 1200 in an alternative embodiment of the present invention in an insulator applying phase. An insulator, such as an oxide 1202, may be formed using one or more processes, such as a thermal oxidation process and filling process. The oxide 1202 fills the trench formed by the substrate 202, the pad oxide layer 204 and the nitride layer 206. A polishing process, such as a chemical mechanical polish, is applied to the upper surface of the oxide 1202 to form a substantially planar surface with the nitride layer 206.

Figure 13:
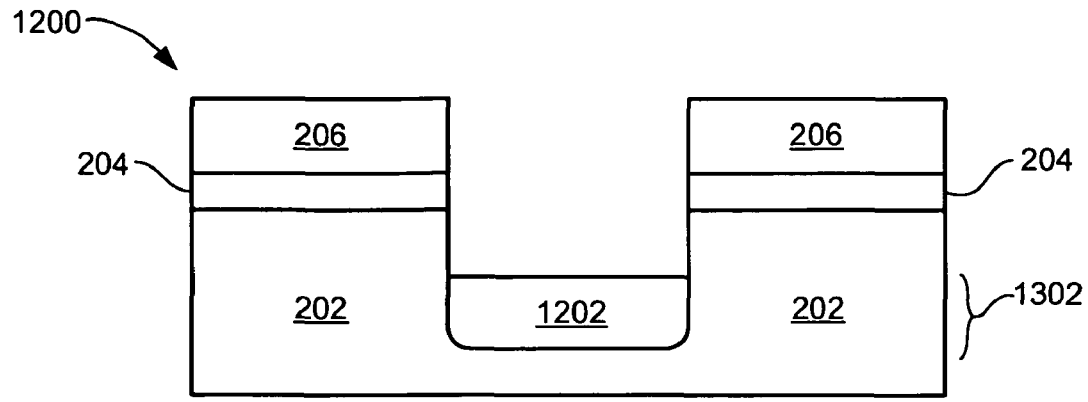
FIG. 13 is a cross-sectional view of the integrated circuit isolation system in an oxide etching phase.

Referring now to FIG. 13, therein is shown a cross-sectional view of the integrated circuit isolation system 1200 in an oxide etching phase. The oxide 1202 is etched back from the trench. An etching process removes a portion of the oxide 1202 across a planar surface of the oxide 1202 conforming to planar dimensions of the trench. The etching process provides a base oxide region 1302 of the oxide 1202 on the bottom of the trench. The etching process also substantially exposes an inner side of the nitride layer 206, an inner side of the pad oxide layer 204 and an inner side of the substrate 202.

Figure 14:
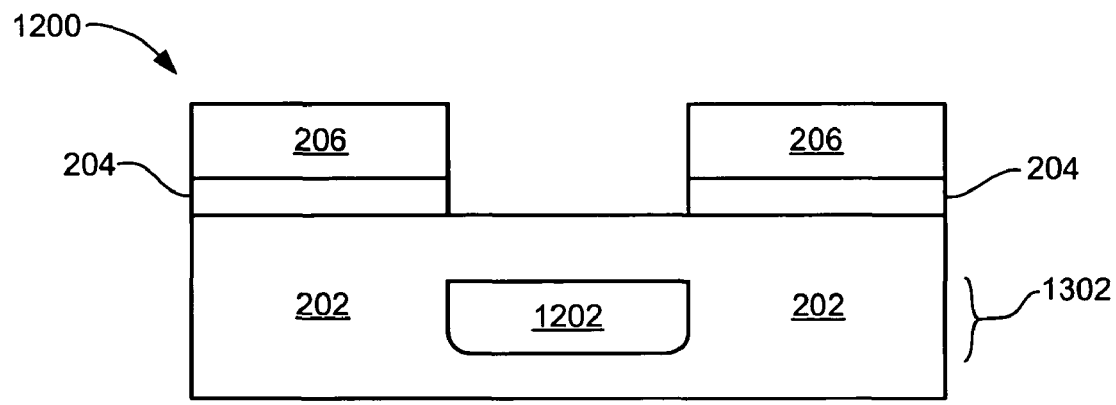
FIG. 14 is a cross-sectional view of the integrated circuit isolation system in a substrate growing phase.

Referring now to FIG. 14, therein is shown a cross-sectional view of the integrated circuit isolation system 1200 in a substrate growing phase. A lateral epitaxial growth of the substrate 202 fills the portion of the trench in the substrate 202. The lateral epitaxial growth also forms the substrate 202 to surround the base oxide region 1302 of the oxide 1202 filling the bottom of the trench. Further, the lateral epitaxial growth provides a horizontal formation of the substrate 202 providing a substantially planar upper surface of the substrate 202.

Figure 15:
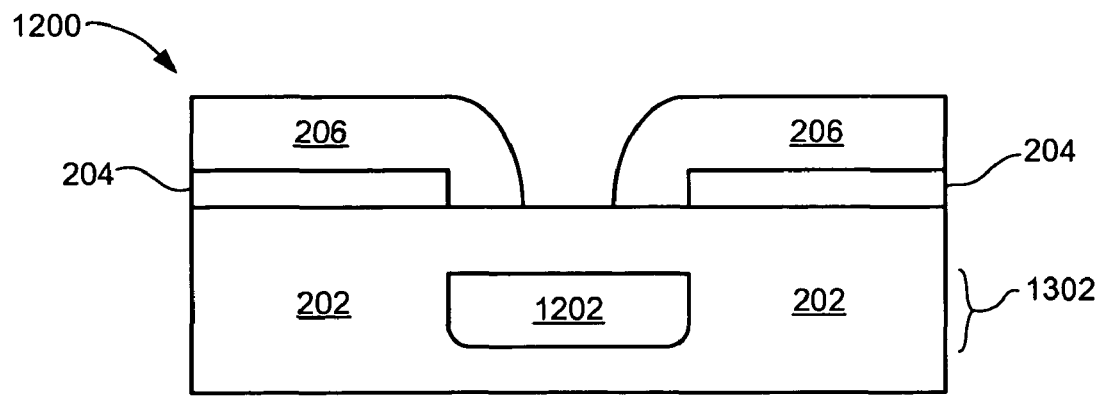
FIG. 15 is a cross-sectional view of the integrated circuit isolation system in a spacer forming phase.

Referring now to FIG. 15, therein is shown a cross-sectional view of the integrated circuit isolation system 1200 in a spacer forming phase. The nitride layer 206 is applied into the trench formed by the pad oxide layer 204 and the nitride layer 206. The nitride layer 206 extends across the inner surface of the pad oxide layer 204 and the inner surface of the nitride layer 206. The nitride layer 206 forms an inner spacer reducing the width of the trench.

Figure 16:
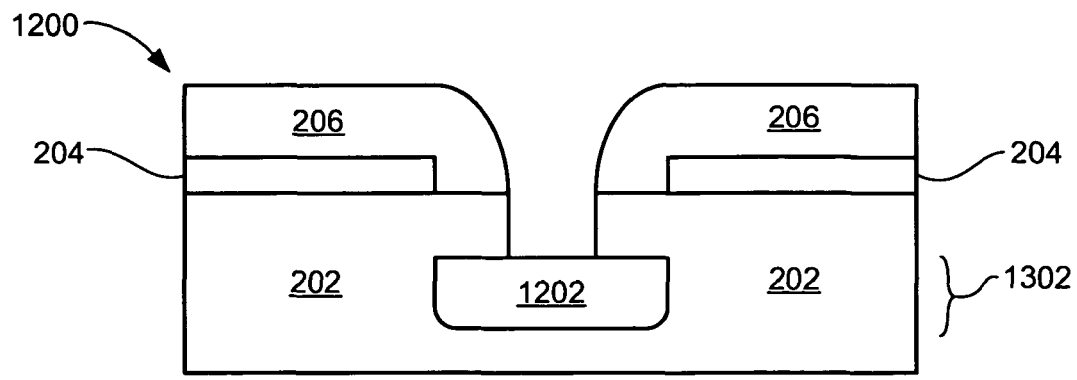
FIG. 16 is a cross-sectional view of the integrated circuit isolation system in a second substrate etching phase.

Referring now to FIG. 16, therein is shown a cross-sectional view of the integrated circuit isolation system 1200 in a second substrate etching phase. An etching process, such as an anisotropic reactive ion etch, removes a portion of the substrate 202. The substrate 202 is partially removed to form a recess with planar dimensions substantially the same as the planar dimensions of the recess formed by the inner spacer of the nitride layer 206. The etching process removes the portion of the substrate 202 to the top surface of the base oxide region 1302 of the oxide 1202 surrounded by the substrate 202.

Figure 17:
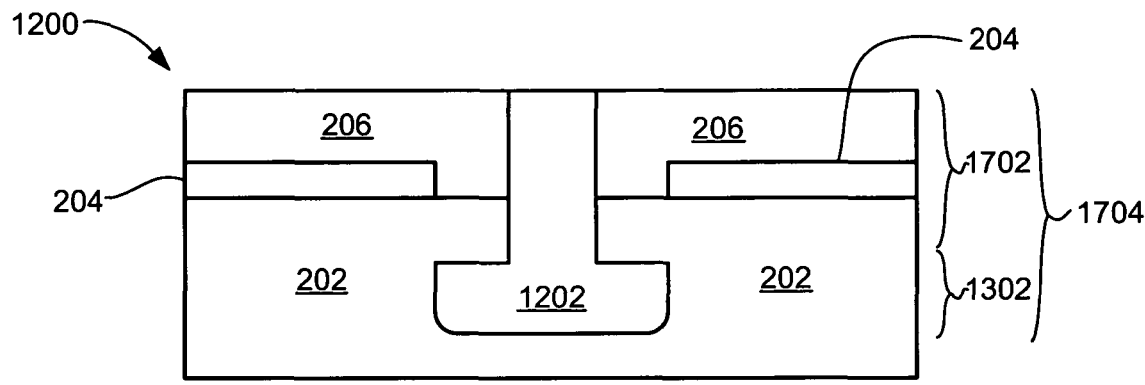
FIG. 17 is a cross-sectional view of the integrated circuit isolation system in an oxide polishing phase.

Referring now to FIG. 17, therein is shown a cross-sectional view of the integrated circuit isolation system 1200 in an oxide polishing phase. An oxide material, similar to the oxide 1202, fills the recess formed by the inner spacer of the nitride layer 206 and the substrate 202. An oxide column 1702 of the oxide 1202 attaches to the base oxide region 1302 of the oxide 1202 forming a self-aligned inverted T-shaped isolation structure 1704. A polishing process, such as chemical mechanical polish, may be applied to form the integrated circuit isolation system 1200.

Figure 18:
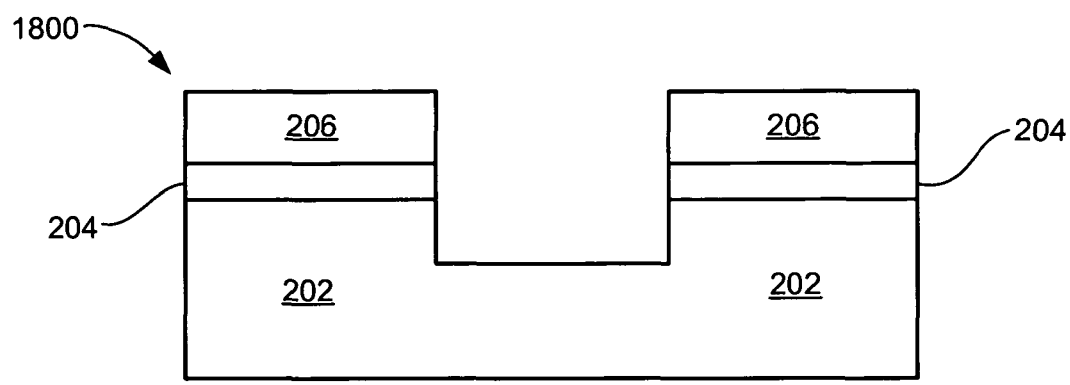
FIG. 18 is a cross-sectional view of an integrated circuit isolation system in another alternative embodiment of the present invention in a first substrate etching phase.

Referring now to FIG. 18, therein is shown a cross-sectional view of an integrated circuit isolation system 1800 in another alternative embodiment of the present invention in a first substrate etching phase. An etching process, such as an anisotropic reactive ion etch, removes a portion of the substrate 202. The substrate 202 is partially removed to form a wide, deep trench with planar dimensions substantially the same as the planar dimensions of the trench in the nitride layer 206 and the pad oxide layer 204.

Figure 19:
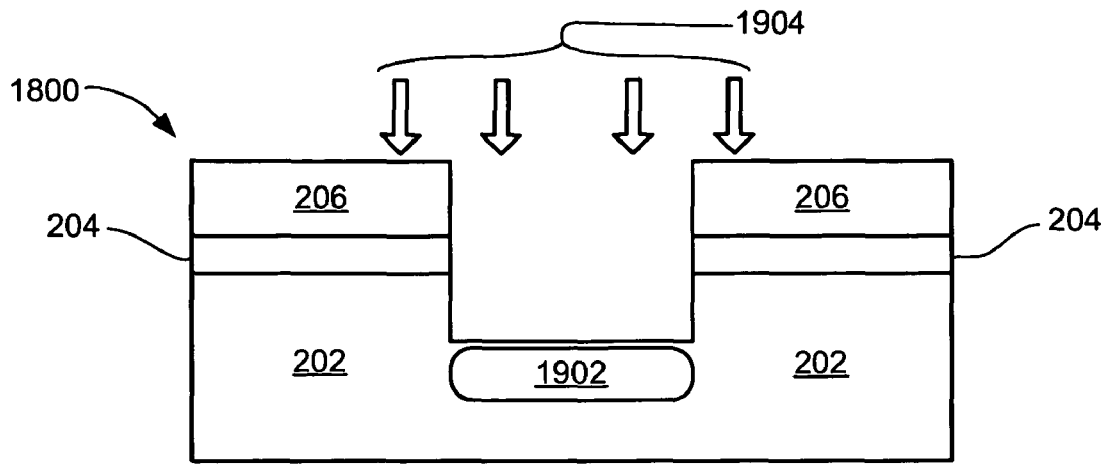
FIG. 19 is a cross-sectional view of the integrated circuit isolation system in an oxide implanting phase.

Referring now to FIG. 19, therein is shown a cross-sectional view of the integrated circuit isolation system 1800 in an insulator implanting phase. An implanted insulator, such as a buried base oxide region 1902, is implanted under the trench and surrounded by the substrate 202. A high dose oxygen implant 1904, between approximately 5E15/cm2 and approximately 1E17/cm2, is applied into the trench formed in the nitride layer 206, the pad oxide layer 204 and the substrate 202. A high temperature anneal, that may be between approximately 900 C and approximately 1350 C for approximately 1 sec to 30 min, is applied to the high dose oxygen implant 1904 forming the buried base oxide region 1902.

Figure 20:
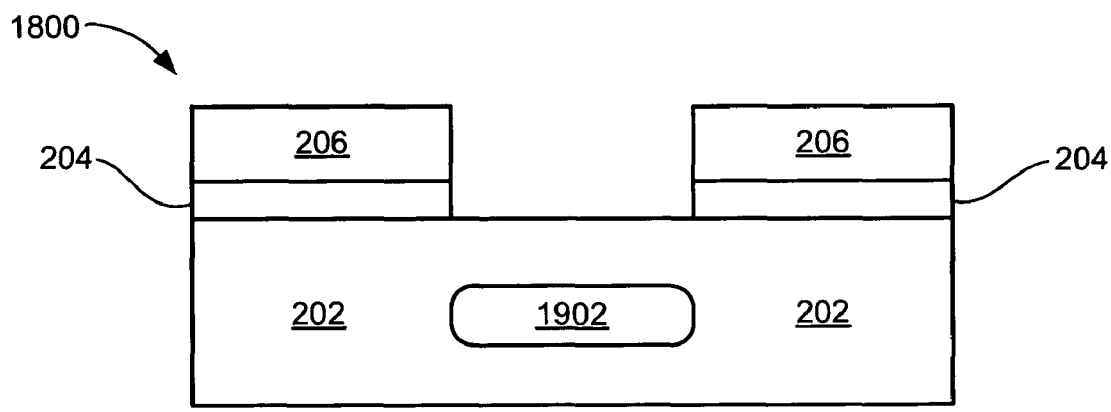
FIG. 20 is a cross-sectional view of the integrated circuit isolation system in a substrate growing phase.

Referring now to FIG. 20, therein is shown a cross-sectional view of the integrated circuit isolation system 1800 in a substrate growing phase. An oxide (not shown) may be formed on sidewalls of the trench. A removal process may be applied to remove the oxide formed on the sidewalls. A lateral and vertical epitaxial growth of the substrate 202 fills the portion of the trench in the substrate 202. The vertical epitaxial growth forms fastest from the bottom of the trench providing trench coverage. Further, the lateral epitaxial growth provides a horizontal formation of the substrate 202 providing a substantially planar upper surface of the substrate 202.

Figure 21:
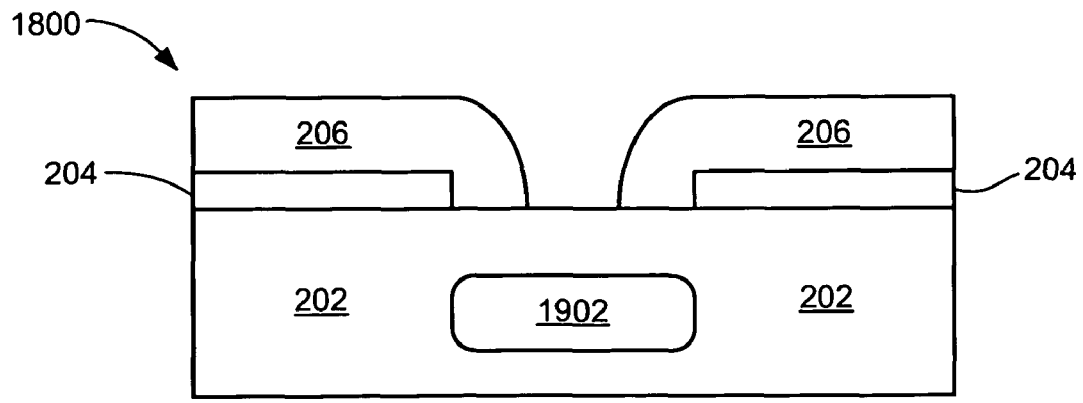
FIG. 21 is a cross-sectional view of the integrated circuit isolation system in a spacer forming phase.

Referring now to FIG. 21, therein is shown a cross-sectional view of the integrated circuit isolation system 1800 in a spacer forming phase. The nitride layer 206 is applied into the trench formed by the pad oxide layer 204 and the nitride layer 206. The nitride layer 206 extends across the inner surface of the pad oxide layer 204 and the inner surface of the nitride layer 206. The nitride layer 206 forms an inner spacer thereby reducing the width of the trench.

Figure 22:
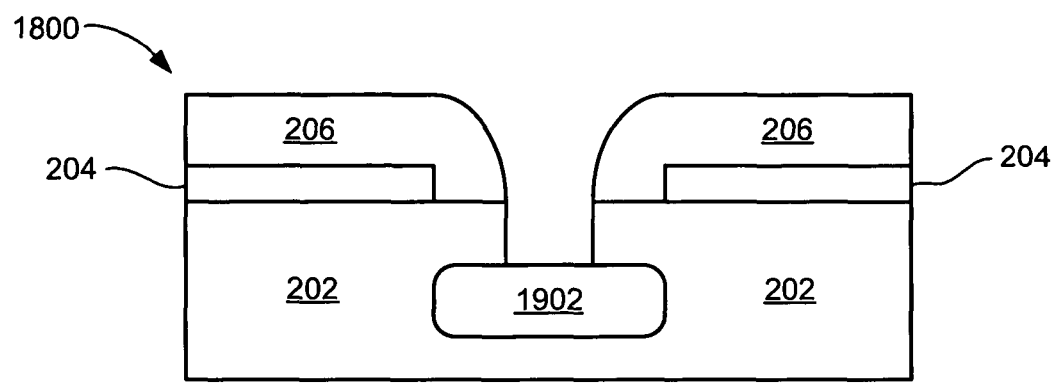
FIG. 22 is a cross-sectional view of the integrated circuit isolation system in a second substrate etching phase.

Referring now to FIG. 22, therein is shown a cross-sectional view of the integrated circuit isolation system 1800 in a second substrate etching phase. An etching process, such as an anisotropic reactive ion etch, removes a portion of the substrate 202. The substrate 202 is partially removed to form a recess with planar dimensions substantially the same as the planar dimensions of the recess formed by the inner spacer of the nitride layer 206. The etching process removes the portion of the substrate 202 to the top surface of the buried base oxide region 1902 surrounded by the substrate 202.

Figure 23:
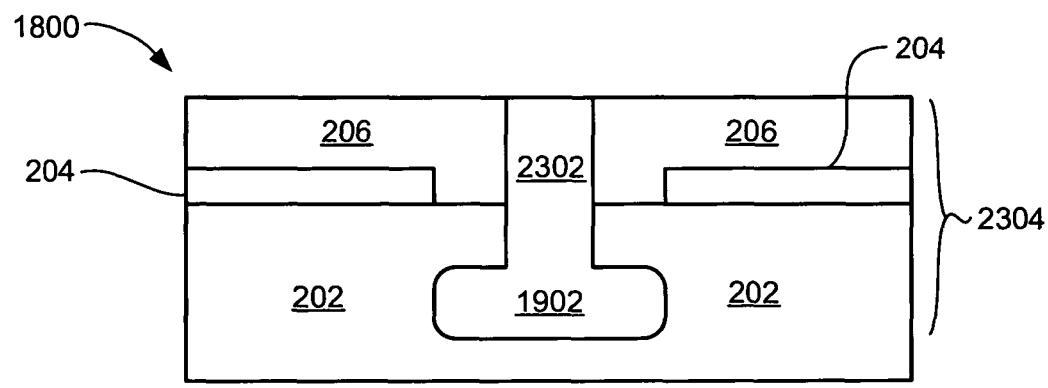
FIG. 23 is a cross-sectional view of the integrated circuit isolation system in an oxide polishing phase.

Referring now to FIG. 23, therein is shown a cross-sectional view of the integrated circuit isolation system 1800 in an oxide polishing phase. An oxide material, similar to the buried base oxide region 1902, fills the recess formed by the inner spacer of the nitride layer 206 and the substrate 202. An oxide column 2302 of the newly deposited oxide attaches to the buried base oxide region 1902 forming a self-aligned inverted T-shaped isolation structure 2304. A polishing process, such as chemical mechanical polish, may be applied to form the integrated circuit isolation system 1800.

Figure 24:
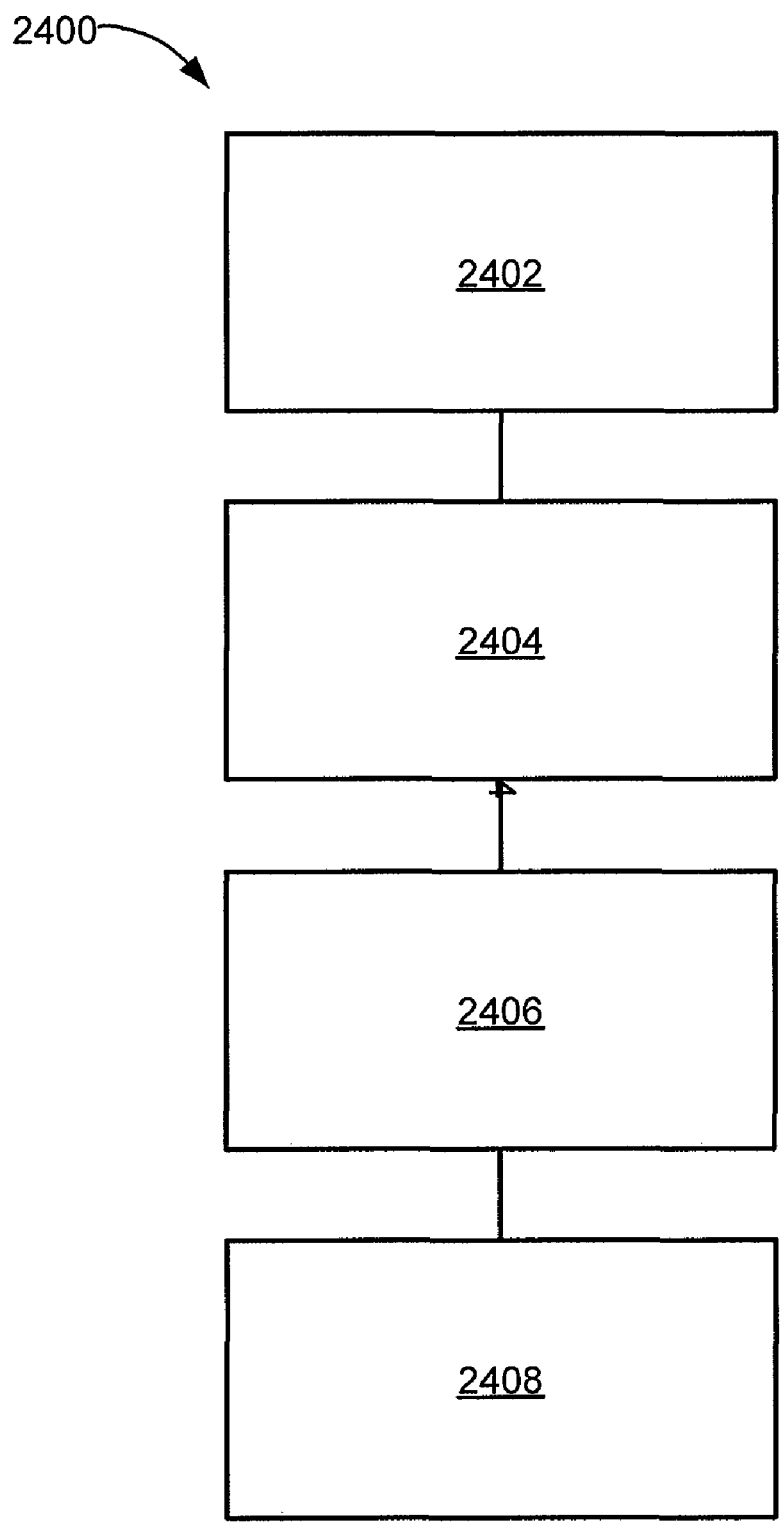
FIG. 24 is a flow chart of an integrated circuit isolation system for manufacturing the integrated circuit isolation system in an embodiment of the present invention.

Referring now to FIG. 24 is a flow chart of an integrated circuit isolation system 2400 for manufacturing the integrated circuit isolation system 100 in an embodiment of the present invention. The system 2400 includes providing a substrate in a block 2402; forming a base insulator region in the substrate in a block 2404; growing the substrate to surround the base insulator region in a block 2406; and depositing an insulator column on the base insulator region in a block 2408.

In greater detail, a method to fabricate the integrated circuit isolation system 100, in an embodiment of the present invention, is performed as follows:
1. Providing the silicon substrate. (FIG. 2)
2. Forming the base oxide region surrounded by the silicon substrate. (FIG. 8)
3. Forming the recess over the base oxide region. (FIG. 10)
4. Depositing the oxide column having a narrower width than the base oxide region in the recess to form the self-aligned inverted T-shaped isolation structure. (FIG. 11)
5. Forming the first device on a one side of the self-aligned inverted T-shaped isolation structure. (FIG. 1)
6. Forming the second device on an opposite side of the self-aligned inverted T-shaped isolation structure. (FIG. 1)

It has been discovered that the present invention thus has numerous aspects.

An aspect is that the present invention provides improved isolation. The base oxide region significantly improves isolation. Additional oxide material in the unique configuration provides the additional isolation.

It has been discovered that the disclosed structure provides improved increased distances the carrier has to travel to cause isolation failure. The base oxide region configuration provides additional distances for the carrier to travel between devices.

It has also been discovered that the disclosed structure provides improved gap fill. The wide trench and thermal anneal provide improved integrity of the oxide through significantly improved gap fill.

Yet another discovery of the disclosed structure is an improvement in the aspect ratio of the trench. The wide trench also provides an overall reduction in the aspect ratio of the trench. The lower aspect ratio improves the gap fill and isolation.

Yet another discovery of the disclosed structure is that the disclosed structure provides a simpler manufacturing process. The base trench enables a simpler deposition process along with the smaller aspect ratio of the recess resulting in reduced steps and complexity.

Yet another discovery of the disclosed structure is that the manufacturing costs are reduced. The reduced steps and complexity of the manufacturing process improves both the cost of manufacturing and the costs of yield loss.

These and other valuable aspects of the present invention consequently further the state of the technology to at least the next level.

Thus, it has been discovered that the integrated circuit system having a self-aligned inverted T-shaped isolation structure method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A method of manufacture of an integrated circuit isolation system comprising:
   providing a substrate;
   forming a base insulator region having a predetermined width in the substrate;
   growing the substrate to surround the base insulator region;
   forming a recess to expose the base insulator region after growing the substrate; and
   forming an insulator column having a width narrower than the base insulator region on the base insulator region to form a self-aligned inverted T-shaped isolation structure.

2. The method as claimed in claim 1 wherein forming the base insulator region comprises:
   depositing a non-conformal insulator in a trench; and
   etching back the non-conformal insulator from the sides of the trench to form a base insulator region on a bottom of the trench.

3. The method as claimed in claim 1 wherein forming the base insulator region comprises:
   depositing an insulator in a trench; and etching back the insulator from the trench across a planar surface of the insulator to form the base insulator region on a bottom of the trench.

4. The method as claimed in claim 1 wherein forming the base insulator region comprises:
   performing a high dose oxygen implant in a trench; and
   applying a high temperature anneal of the high dose oxygen implant to form a buried base insulator region.

5. The method as claimed in claim 1 wherein depositing the insulator column comprises filling an insulator into the recess on the base insulator region.

6. A method of manufacture of an integrated circuit isolation system comprising:
   providing a silicon substrate;
   forming a base oxide region having a predetermined width in the silicon substrate;
   growing the silicon substrate to surround the base oxide region;
   forming a recess to expose the base oxide region after growing the silicon substrate;
   depositing an oxide column having a width narrower than the base oxide region in the recess to form a self-aligned inverted T-shaped isolation structure;
   forming a first device on a one side of the self-aligned inverted T-shaped isolation structure system; and
   forming a second device on an opposite side of the self-aligned inverted T-shaped isolation structure system.

7. The method as claimed in claim 6 wherein forming the base oxide region comprises depositing an oxide in a trench.

8. The method as claimed in claim 6 wherein forming the base oxide region comprises implanting and annealing oxygen into the silicon substrate below a trench.

9. The method as claimed in claim 6 wherein forming a recess comprises forming a nitride layer extending into a trench.

10. The method as claimed in claim 6 wherein depositing the oxide column comprises depositing an oxide attached to the base oxide region.

* * * * *